United States Patent
Jiang et al.

(10) Patent No.: US 9,503,622 B2
(45) Date of Patent: Nov. 22, 2016

(54) PREVENTING ARTIFACTS DUE TO UNDERFILL IN FLIP CHIP IMAGER ASSEMBLY

(71) Applicant: Apple Inc., Cupertino, CA (US)

(72) Inventors: Tongbi T. Jiang, Santa Clara, CA (US); Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 123 days.

(21) Appl. No.: 14/202,256

(22) Filed: Mar. 10, 2014

(65) Prior Publication Data

US 2015/0256725 A1    Sep. 10, 2015

(51) Int. Cl.
*H04N 5/225* (2006.01)
*H04N 5/374* (2011.01)

(52) U.S. Cl.
CPC .......... *H04N 5/2253* (2013.01); *H04N 5/2257* (2013.01); *H01L 2224/16225* (2013.01); *H01L 2224/27013* (2013.01); *H01L 2924/10157* (2013.01); *H01L 2924/15151* (2013.01); *H04N 5/374* (2013.01)

(58) Field of Classification Search
CPC . G06F 9/45533; G06F 9/455; H01L 21/563; H01L 23/3121; H01L 31/0203; H01L 24/32; H01L 2224/73203; H01L 2924/01078; H01L 2924/01079; H01L 2224/73265; H01L 2224/32245; H01L 2224/48247; H01L 2924/00; H01L 2224/16245; H01L 2224/48091; H01L 25/167; H01L 27/14618; H01L 33/48; H01L 31/02; H01L 2224/16; H04N 5/2253
See application file for complete search history.

(56) References Cited

U.S. PATENT DOCUMENTS

| | | | |
|---|---|---|---|
| 8,586,422 B2 | 11/2013 | Camacho et al. | |
| 2008/0179738 A1* | 7/2008 | Nishimura | H01L 21/563 257/737 |
| 2009/0224386 A1* | 9/2009 | Camacho | H01L 21/563 257/680 |
| 2010/0290191 A1* | 11/2010 | Lin | H01L 23/49816 361/704 |
| 2012/0267731 A1 | 10/2012 | Graf et al. | |
| 2013/0264599 A1 | 10/2013 | Kikuchi et al. | |

FOREIGN PATENT DOCUMENTS

WO    0111694    2/2001

\* cited by examiner

*Primary Examiner* — Twyler Haskins
*Assistant Examiner* — Carramah J Quiett
(74) *Attorney, Agent, or Firm* — Robert C. Kowert; Meyertons, Hood, Kivlin, Kowert & Goetzel, P.C.

(57) ABSTRACT

A CMOS imager assembly may include an integrated circuit (IC) having an active-pixel image sensor that is mounted on a printed circuit board (PCB) substrate using flip chip packaging technology. The IC and the PCB may be physically and electrically connected to each other through multiple electrically conductive connectors. An underfill material (which may include an anti-reflective material) may, during assembly, be introduced around the connectors in the space between the IC and the PCB. A chemical or physical discontinuity on the integrated circuit may, during assembly, prevent the underfill material from entering an area framed by the discontinuity, which may include the pixel array of the image sensor. The discontinuity may include a dam-like structure built up on the IC, a trench-like structure created on the IC, or a low surface tension material that has been applied to the surface of the IC.

20 Claims, 11 Drawing Sheets

PREVENTING ARTIFACTS DUE TO UNDERFILL IN FLIP CHIP IMAGER ASSEMBLY

BACKGROUND

Technical Field

This disclosure relates generally to integrated circuit packaging, and more specifically to preventing artifacts due to underfill in a flip chip imager assembly.

Description of the Related Art

Various devices including but not limited to personal computer systems, desktop computer systems, laptop and notebook computers, tablet or pad devices, digital cameras, digital video recorders, and mobile phones or smart phones may include software and/or hardware that may implement image capture using an image sensor (e.g., one that includes an array of pixel sensors) and an image processor. For example, a device may include an apparatus (e.g., an integrated circuit (IC), such as a system-on-a-chip (SOC), or a subsystem of an IC), that includes an image sensor that collects image information using one or more photodetectors and/or an image processor that processes the collected image information for transmission, display, manipulation, and/or storage.

Flip chip (FC) packaging is commonly used in complementary metal-oxide-semiconductor (CMOS) image sensor (CIS) devices in which the active pixel arrays are mounted faced-down on a printed circuit board (PCB) using a solder alloy, gold-to-gold interconnect, or copper pillars. A composite underfill (UF) material is typically used to reinforce the interconnection for mechanical and drop protection. Flip chip (FC) packaging has been used in packaging backside-illuminated (BSI) image sensors and frontside-illuminated (FSI) image sensors.

SUMMARY OF EMBODIMENTS

Embodiments of a CMOS imager assembly are described that include an integrated circuit (IC) having an active-pixel image sensor. The IC is mounted on a printed circuit board (PCB) substrate using flip chip packaging technology. In at least some embodiments, the IC and the PCB may be physically and electrically connected to each other through multiple electrically conductive connectors. For example, the IC and the PCB may include contact pads connecting them to the electrically conductive connectors. The electrically conductive connectors may include solder bumps, metal pillars, plated pillars, plated solder bumps, or other connecting structure that includes an electrically conductive material. In at least some embodiments, the width or diameter of the electrically conductive connectors may be substantially less than in some existing imager assemblies, which may allow a higher percentage of the area on the IC to be utilized for the active area of the image sensor than in those exiting imager assemblies.

In at least some embodiments, an underfill material may, during assembly, be introduced around the connectors in the space between the IC and the PCB. In some embodiments, this underfill material may include an anti-reflective material. For example, the underfill may include carbon black pigment, which may reduce or eliminate the reflection of incoming light off of the underfill material and onto the active-pixel image sensor.

In at least some embodiments, a chemical or physical discontinuity on the integrated circuit may, during assembly, prevent the underfill material from entering an area framed by the discontinuity, e.g., an area which may include the pixel array of the image sensor. In various embodiments, the discontinuity may include a dam-like structure built up on the IC (e.g., using metal or metal oxide), a trench-like structure created on the IC (e.g., using an etching operation or a laser), or a low surface tension material that has been applied to the surface of the IC.

The techniques described herein for reducing and/or preventing image artifacts due to underfill in a flip chip imager assembly may in some embodiments facilitate the increased scaling of stacked die CMOS image sensor packaging for a variety of applications, including applications implemented in mobile devices, without introducing such artifacts.

Figure 1:
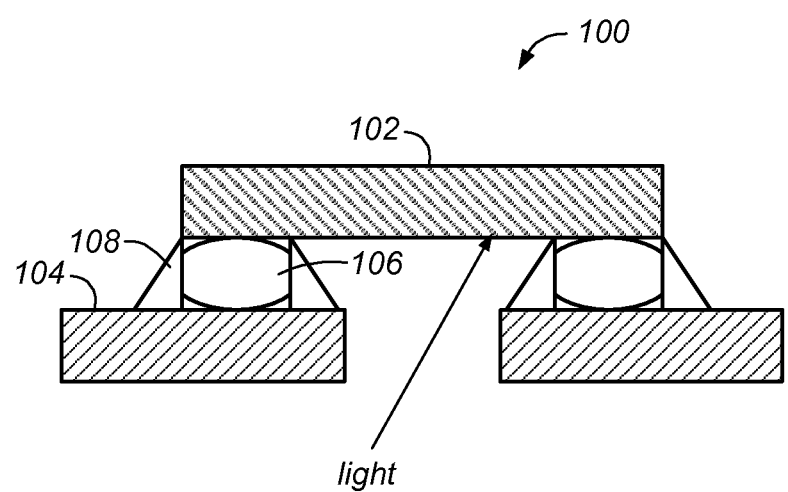
FIG. 1 is a block diagram illustrating a cross-section of an imager assembly, according to at least some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

In various embodiments, the imager assemblies described herein may include an integrated circuit (IC) having an active-pixel image sensor, such as a CMOS active-pixel image sensor that includes an array of pixel sensors. Each pixel sensor in such an array may include a photodetector element and an active amplifier. The IC may be mounted on a printed circuit board (PCB) substrate using flip chip packaging technology such that the active pixel arrays are face-down (i.e., facing the printed circuit board). For example, flip chip packaging technology may be employed when assembling image sensor devices for use in high end digital cameras or for use in cameras integrated within in other devices and products, such as mobile phones or smart phones. As noted above, flip chip packaging may be used in packaging backside-illuminated (BSI) image sensors (sometimes referred to as Backside Sensing Imagers) and/or frontside-illuminated (FSI) image sensors. Note that these sensors may include CMOS image sensors and/or charge-coupled devices (CCD) image sensors, in different embodiments. In various embodiments, the PCB onto which an active-pixel image sensor is mounted may be a rigid type board (such as a Bismaleimide-Triazine, or BT, resin based board), or flexible type (such as a Polyimide, or PI, based board).

In at least some embodiments, the IC and the PCB may be physically and electrically connected to each other through multiple electrically conductive connectors. For example, each of multiple contact pads on the IC may be connected to a corresponding contact pad on the PCB through a respective one or the electrically conductive connectors. The electrically conductive connectors may include solder bumps, metal pillars, plated pillars, plated solder bumps, or in general any other connecting structure that includes an electrically conductive material. As die sizes continue to shrink, the interconnect area may become a limiting factor in the functionality that that be included in the image sensor (e.g., due to the die area available for the pixel array). In some embodiments, in order to maximum the die area available for the pixel array as die sizes shrink, the interconnect and/or the underfill area may be scaled down proportionally. For example, as noted above, in at least some embodiments, the width or diameter of the electrically conductive connectors used in the imager assemblies described herein may be substantially less than in some existing imager assemblies, which may allow a higher percentage of the area on the IC to be utilized for the active area of the image sensor than in those exiting imager assemblies.

In some embodiments of the imager assemblies described herein, a composite underfill (UF) material that is comprised of a polymer and one or more fillers may be used to fill the space between the sensor and the PCB substrate. The introduction of this underfill material may serve to reinforce the interconnection, e.g., for mechanical and/or drop protections. However, as described in more detail below, the underfill material may cause unwanted image artifacts in some cases, especially when too little underfill material is introduced into the space during assembly, or when an over-abundance of underfill material is introduced into the space during assembly.

FIG. 1 is a block diagram illustrating a cross-section of a portion of an imager assembly, according to some embodiments. In this example, imager assembly 100 includes a sensor die 102 (e.g., an integrated circuit that includes an active-pixel image sensor) and a printed circuit board substrate 104 (which includes an opening through which light passes). In this example, sensor die 102 and PCB 104 are physically and electrically connected to each other through solder bumps 106, and underfill 108 has been introduced into the space between sensor die 102 and PCB 104 for reinforcement of these connections. In this example, sensor die 102 and PCB 104 may include contact pads through which connections to solder bumps 106 are made (e.g., for each of multiple contact pads on sensor die 102, there may be a corresponding contact pad on PCB 104, and the contact pads in each such pair may be connected to each other through a respective solder bump).

In this example, sensor die 102 is mounted using a flip chip packaging technology such that the active area (e.g., the pixel array of the active-pixel image sensor) faces PCB 104. Light enters a device or apparatus that includes imager assembly 100 (e.g., a digital camera, mobile phone, or smart phone) through an opening in PCB 104. In some embodiments, the light may also pass through glass and/or one or more lenses before reaching the pixel array of the active-pixel image sensor on sensor die 102 (either before or after passing through the opening in PCB 104 (not shown)).

As the packaging of CMOS image sensors continues to move to stacked die technologies for assembling a wafer level bonded pixel array die and image processor die in a single package, the distance between the peripheral interconnect region (e.g., the region around the periphery of the die containing contact pads) and the pixel array boundary may become a limiting factor in scaling down the pixel die size or in maximizing the pixel array area with a die of a given side.

In addition, as noted above, issues related to the use of underfill material may in some cases affect image quality. For example, excessive UF may cause unwanted light rays reflecting from the UF to reach the pixels of the pixel array, resulting in flares in the captured image. As image sensor die sizes continue to shrink (and the pixel array gets closer to edges of the die), artifacts due to underfill can become an even bigger problem. For example, in order to utilize the maximum percentage of the sensor die for the pixel array itself, a smaller percentage of the sensor die area may be available for the interconnect region and the underfill. Because of the tighter space into the underfill material is introduced, an overflow of the underfill material into the pixel array region may be common. This overflow of underfill material into the pixel array region may create image quality issues.

In some cases, if an overcorrection is made when attempting to reduce or prevent the overflow of underfill material into the pixel array region, there may be insufficient underfill (e.g., on the edge of the die) in the imager assembly. Insufficient underfill material on the edge of the die may result in exposed interconnect (e.g., solder bumps) between the image sensor die and the PCB on which it is mounted, which may cause unwanted light rays to be reflected from the interconnect onto the pixel array, again distorting the image and/or reducing image quality through the inducement of flares.

In various embodiments, one or more of the techniques described herein for controlling underfill during the assembly process and/or for otherwise reducing artifacts caused by too little or too much underfill material may continue to be applicable as integrated circuit manufacturing and packaging technologies continue to be advanced. For example, these techniques may be employed to prevent artifact due to underfill in stacked die packaging solutions in which a pixel array die is bonded to a image processing die in order to save real estate in mobile devices. As described in more detail below, these techniques may include topological (physical) and/or chemical changes or manipulations to create areas of discontinuity to prevent the overflow of underfill material, and/or changes to the interconnect structures and/or materials used in assembling the imagers.

In some embodiments, underfill material may be used to reinforce mechanical interconnections between the sensor die and the PCB substrate on which it is mounted. In an extreme case in which insufficient underfill material is introduced in the space between the sensor die and the PCB substrate, if a contact pad (bond pad) or any portion of a metal structure used in the connection between the sensor die and the PCB substrate is exposed when incoming light gets into those regions, the light may be reflected back into the sensor (e.g., into the camera) to cause unwanted image artifacts (e.g., flares or other effects).

Figure 2A:
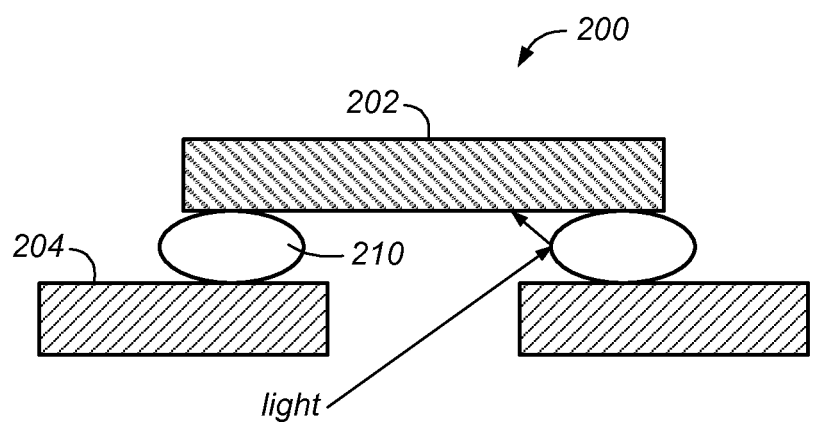
FIG. 2A is a block diagram illustrating a cross-section of an imager assembly in which there is an insufficient amount of underfill material, according to at least some embodiments.
Figure 2B:
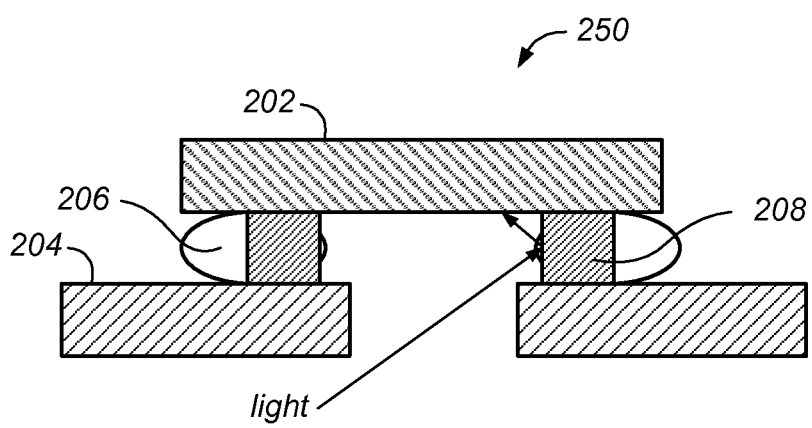
FIG. 2B is a block diagram illustrating a cross-section of an imager assembly in which there is an over-abundance of underfill material, according to at least some embodiments.

At least some of the conditions that may cause underfill-related artifacts in an imager assembly are illustrated in FIGS. 2A and 2B. In both of these examples, imager assembly 200 and imager assembly 250 each include a sensor die 202 (e.g., an integrated circuit that includes an active-pixel image sensor) and a printed circuit board substrate 204 (which includes an opening through which light passes). In these examples, sensor die 202 and PCB 204 are physically and electrically connected to each other through solder bumps 206, and underfill 208 has been introduced into the space between sensor die 202 and PCB 204 for reinforcement of these connections. In these examples, sensor die 202 and PCB 204 may include contact pads through which connections to solder bumps 206 are made (e.g., for each of multiple contact pads on sensor die 202, there may be a corresponding contact pad on PCB 204, and the contact pads in each such pair may be connected to each other through a respective solder bump).

In both of these examples, sensor die 202 is mounted using a flip chip packaging technology such that the active area (e.g., the pixel array of the active-pixel image sensor) faces PCB 204. Light enters a device or apparatus that includes an imager assembly 200 or 250 (e.g., a digital camera, mobile phone, or smart phone) through an opening in its PCB 204. In some embodiments, the light may also pass through glass and/or one or more lenses before reaching the pixel array of the active-pixel image sensor on sensor die 202, either before or after passing through the opening in PCB 204 (not shown).

More specifically, however, FIG. 2A is a block diagram illustrating a cross-section of a portion of an imager assembly in which there is an insufficient amount of underfill (not visible in FIG. 2A). As illustrated in this example, when there is insufficient underfill between sensor die 202 and PCB 204, the incoming light may be reflected off of solder bumps 206 and onto the pixel array of the active-pixel image sensor, which may cause visual artifacts in the image captured by the imager assembly. On the other hand, FIG. 2B is a block diagram illustrating a cross-section of a portion of an imager assembly in which there is an over-abundance of underfill. As illustrated in this example, when there is an over-abundance of underfill between sensor die 202 and PCB 204, the incoming light may be reflected off of the underfill (shown as 208 in FIG. 2B) and onto the pixel array of the active-pixel image sensor, which may cause visual artifacts in the image captured by the imager assembly.

In some embodiments of the imager assemblies described herein, in order to reduce image artifacts induced by reflections off of the underfill material and back to the image sensor pixel array, the composite underfill material may be formulated in a manner that reduces the reflective properties of the underfill material. For example, in embodiments, in which the underfill material is a composite material that is comprised of a polymer and one or more fillers, at least one of those fillers may include an anti-reflective material. This anti-reflective material may be included in the composite underfill materiel in an amount sufficient to cause the composite underfill material to absorb, rather than to reflect, light. For example, in one example, carbon black pigments (e.g., of an amount on the order of 1-10%) may be added to the composite underfill formulation, and this material may cause the composite underfill material to be anti-reflective without negatively impacting the flow properties or the reliability of the underfill material in reinforcing connections between the image sensor die and the PCB on which it is mounted. In other embodiments, the composite underfill formulation may include other anti-reflective fillers instead of, or in addition to black carbon pigments in order to cause the composite underfill to absorb, rather than reflect, light.

Figure 3A:
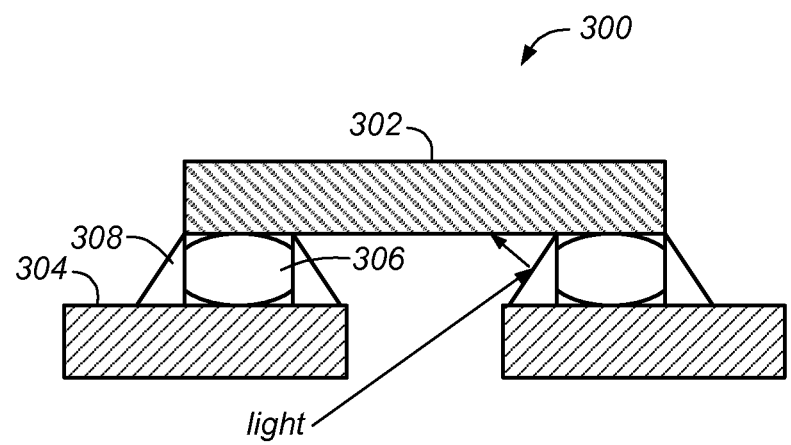
FIG. 3A is a block diagram illustrating a cross-section of an imager assembly in which the underfill material reflects light onto the image sensor pixel array, according to at least some embodiments.
Figure 3B:
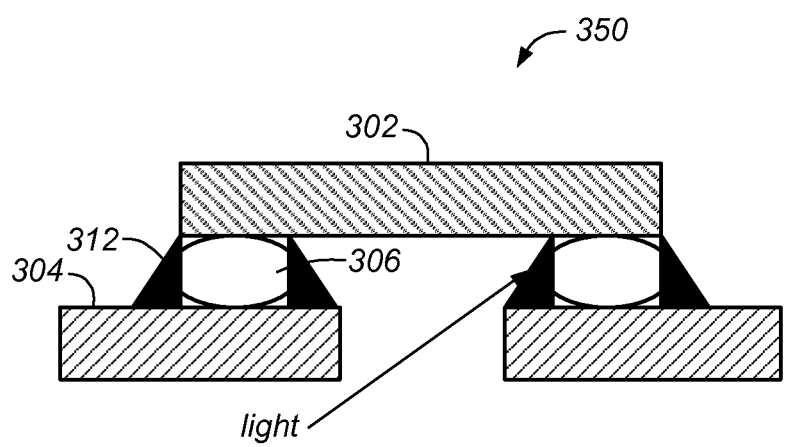
FIG. 3B is a block diagram illustrating a cross-section of an imager assembly in which the underfill material does not reflect light, according to at least some embodiments.

The use of an anti-reflective material in a composite underfill may be illustrated by the block diagrams in FIGS. 3A and 3B, according to at least some embodiments. More specifically, FIG. 3A is a block diagram illustrating a cross-section of an imager assembly 300 in which the underfill 308 reflects a portion of the incoming light onto the image sensor pixel array. In this example, the reflection of the incoming light off of underfill 308 and onto the pixel array of the active-pixel image sensor may cause visual artifacts in the image captured by the imager assembly. By contrast, FIG. 3B is a block diagram illustrating a cross-section of an imager assembly 350 in which the underfill 312 (which includes an anti-reflective material, such as carbon black pigment) does not reflect light, thus avoiding artifacts due to the underfill.

In both of these diagrams, sensor die 302 is mounted using a flip chip packaging technology such that the active area (e.g., the pixel array of the active-pixel image sensor) faces PCB 304. Light enters a device or apparatus that includes an imager assembly 300 or 350 (e.g., a digital camera, mobile phone, or smart phone) through an opening in its PCB 304. In some embodiments, the light may also pass through glass and/or one or more lenses before reaching the pixel array of the active-pixel image sensor on sensor die 302, either before or after passing through the opening in PCB 304 (not shown).

As previously noted, if an over-abundance of underfill material is introduced during assembly of an imager, it may flow onto the active area of the image sensor die (e.g., over or onto the image sensor pixel array). This may cause problems on the sensor itself (e.g., affecting the performance or functionality of the sensor, and thus the camera) and/or may distort light on the sensor. For example, if the underfill material flow over the top of the pixel array of the active area, it may contaminate one or more pixel sensors or create a barrier that prevents light from reaching one or more of the pixel sensors (causing some portions of a captured image to be darker than they should be, for example, or resulting in a loss of some image information). In some cases, the presence of underfill material in the active area of the image sensor may deform one or more of the lenses (e.g., by adding an additional layer of material to the surface of the lenses, flattening or otherwise changing their shape) or otherwise create a distortion on the lenses. This may potentially change the refractive index of the lens or otherwise affect the focus of the lens. In another example, underfill material that overflows into the active pixel region in the center of an image sensor die may create stress induced image non-uniformity, in some cases. In addition, the thin layer of a resin in underfill material that has migrated into the active region may also a source of light reflection.

Figure 4A:
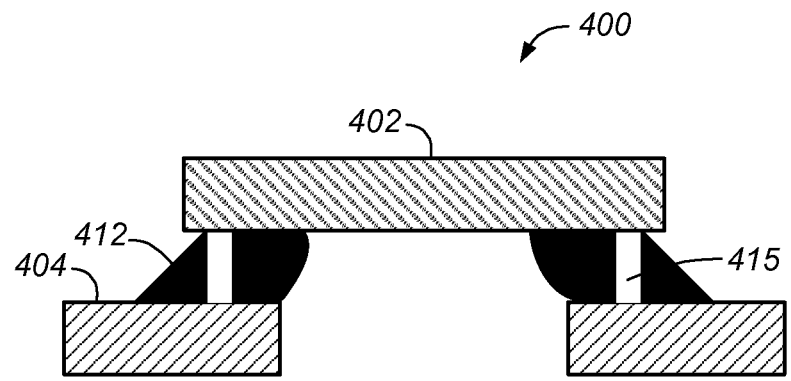
FIG. 4A is a block diagram illustrating a cross-section of an imager assembly in which the underfill material extends onto the image sensor pixel array, according to at least some embodiments.
Figure 4B:
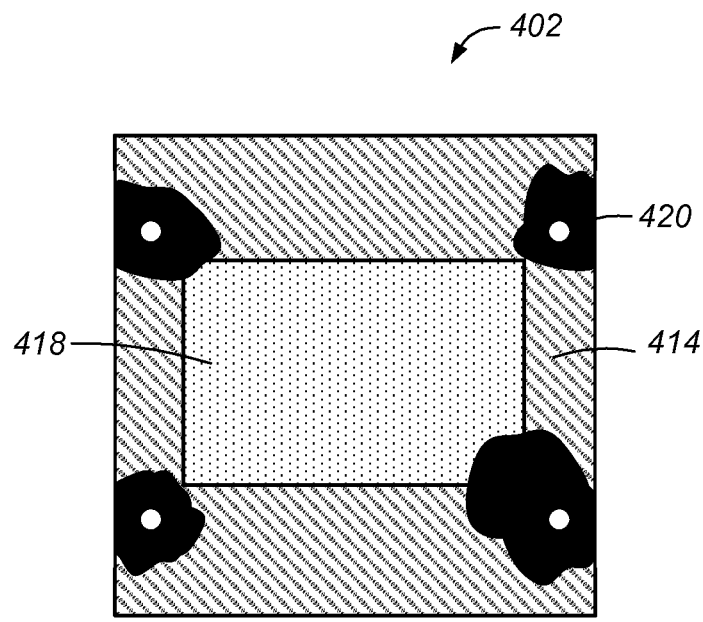
FIG. 4B is a block diagram illustrating a backside view of an image sensor in an imager assembly in which the underfill material extends onto the image sensor pixel array, according to at least some embodiments.

FIGS. 4A and 4B illustrate these additional conditions that may cause underfill-related artifacts in an imager assembly, according to at least some embodiments. More specifically, FIG. 4A is a block diagram illustrating a cross-section of an imager assembly in which the underfill extends onto the image sensor pixel array, and FIG. 4B is a block diagram illustrating a backside view of the image sensor 402. In this example, imager assembly 400 includes a sensor die 402 (e.g., an integrated circuit that includes an active-pixel image sensor) and a printed circuit board substrate 404 (which includes an opening through which light may pass). In this example, sensor die 402 and PCB 404 are physically and electrically connected to each other through copper pillars 415, and underfill 412 (which may or may not include an anti-reflective material, in this example) has been introduced into the space between sensor die 402 and PCB 404 for reinforcement of these connections. However, underfill 412 has (e.g., during assembly), spilled over onto the active-pixel image sensor 418 of sensor die 402, which may cause visual artifacts in the image captured by the imager assembly.

In this example, sensor die 402 and PCB 404 may include contact pads through which connections to copper pillars 415 are made (e.g., for each of multiple contact pads on sensor die 402, there may be a corresponding contact pad on PCB 504, and the contact pads in each such pair may be connected to each other through a respective copper pillar).

In this example, sensor die 402 is mounted using a flip chip packaging technology such that the active area (e.g., the pixel array of the active-pixel image sensor) faces PCB 404. Light may enter a device or apparatus that includes imager assembly 400 (e.g., a digital camera, mobile phone, or smart phone) through an opening in PCB 404. In some embodiments, the light may also pass through glass and/or one or more lenses before reaching the pixel array of the active-pixel image sensor on sensor die 402 (either before or after passing through the opening in PCB 404 (not shown).

Note that while these and other examples illustrate embodiments in which the connections between the IC and PCB are made using metal pillars, in other embodiments, these connections may be made using solder bumps, plated pillars, plated solder bumps, or in general any connecting structure comprising an electrically conductive material.

As discussed above, image sensors are becoming smaller and smaller, and are beginning to be packaged using stacked die technology. With stacked die technology, the peripheral circuitry (e.g., circuitry other than the image sensor pixel array itself) may be moved to another die, and the area on the sensor die may be used primarily for the pixel array, for contact areas (e.g., bonding pads) and for some additional interconnections, as appropriate. As die sizes shrink, the pixel array becomes closer to the bond pad, leaving less space available to tolerate the underfill position issues described above (e.g., issues due to insufficient underfill material and/or to an over-abundance of underfill material). In fact, using existing approaches, constraints on the position of the underfill material may become a limiting factor in the design rules that specify how far the pixel array can be from the bond pads (e.g., the minimum required distance between the pixel array and the bond pads), since this distance must be large enough to prevent the underfill material from flowing into the sensor array. This may result in a large percentage of un-used (and wasted) space on the image sensor die.

In some embodiments, the techniques described herein for preventing the overflow of underfill material when assembling an imager may reduce the amount of wasted space on the image sensor die by reducing the required distance between the bond pads and the pixel array (rather than relying on a large distance to prevent the overflow of underfill material). In some embodiments, these techniques may include reducing the interconnect underfill area required in some existing imager assembly techniques by replacing solder bump connections with copper pillar connections or plated copper pillars. In some embodiments, these copper pillar connectors may have substantially smaller widths and/or diameters than traditional solder bump connections. In one example, by the replacing solder bump connectors with plated copper pillars, the diameter of the connectors may be reduced from about 100 µm to less than 30 µm. In this example, the height of the plated structures may be on the order of 30-50 µm. In various embodiments, similar reductions in the size of the interconnect structures may be realized using pillars of other conductive materials (e.g., other metals). In some embodiments, reducing the size of the interconnect structures used in imager assembly may result in reducing the amount of underfill requires to reinforce the connections between the image sensor die and the PCB on which it is mounted.

In some embodiments, the techniques described herein for preventing the overflow of underfill material may include the creating of a "keep out zone" on the image sensor die. In order to create a keep out zone, a region of physical and/or chemical discontinuity may be created between the bond pad area and the active area (e.g., the pixel array) that surrounds the active area and prevents underfill material from being introduced into the keep out zone during assembly. For example, in some embodiments, this region of discontinuity may be creating by building up a wall or dam-like structure of metal or metal oxide layers that serve as a physical barrier to prevent the flow of underfill material into the active area.

Figure 5:
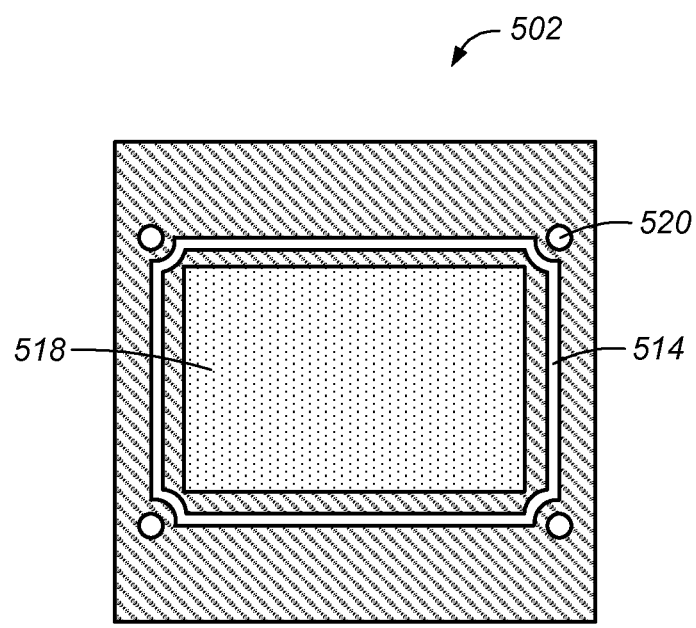
FIG. 5 is a block diagram illustrating a backside view of an image sensor in an imager assembly in which the image sensor pixel array is surrounded by a physical or chemical discontinuity, according to at least some embodiments.

FIG. 5 is a block diagram illustrating a backside view of an image sensor in an imager assembly in which the image sensor pixel array is surrounded by a physical or chemical discontinuity, according to at least some embodiments. In this example, an image sensor die 502 includes an active area 518 (e.g., an image sensor pixel array), contact pads 520 (for connecting to a printed circuit board through respective electrically conducting structures using flip chip packaging technology) outside of the active area 518, and a discontinuity 514 (between the contact pads 520 and the active area 518). Note that the number and position of contact pads may vary, depending on the functionality of the image sensor and/or the imager into which it will be assembled. In this example, the frame formed by discontinuity 514 (which is approximately rectangular, but includes recessed areas in the corners of the die and/or near the bond pads) defines the keep out area on the sensor die 502. In other words, the physical and/or chemical properties of discontinuity 514 may prevent underfill from entering the area framed by discontinuity 514 (which includes active area 518) during the assembly process.

Figure 6A:
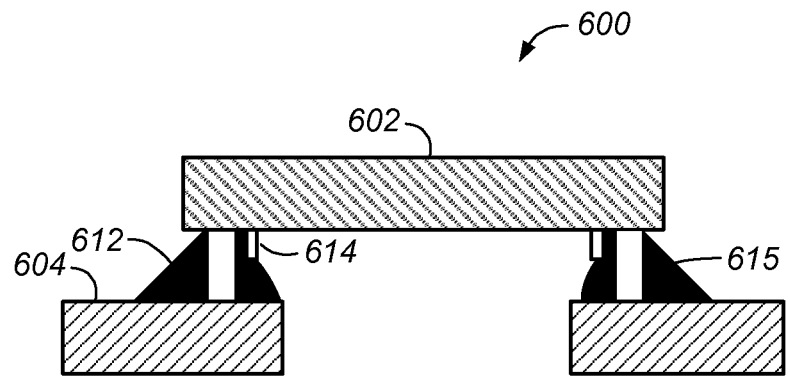
FIG. 6A is a block diagram illustrating a cross-section of an image sensor in an imager assembly in which a dam-like structure is built up to prevent underfill material from extending onto the image sensor pixel array during assembly, according to at least some embodiments.
Figure 6B:
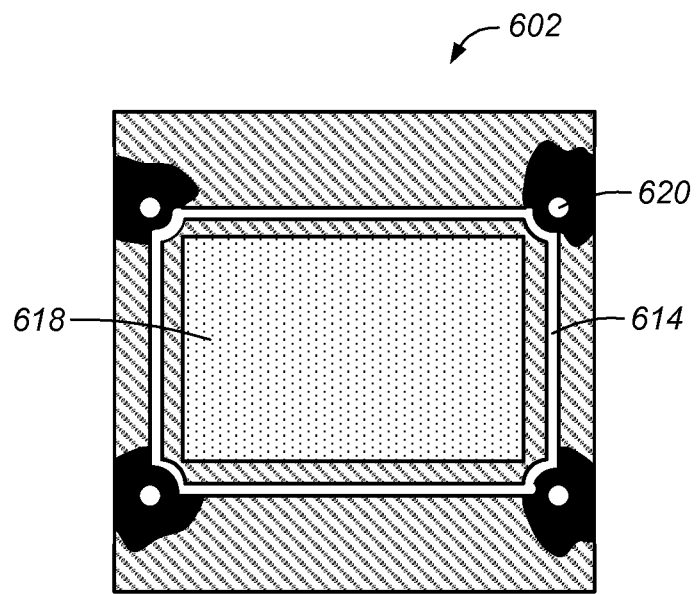
FIG. 6B is a block diagram illustrating a backside view of an image sensor in an imager assembly in which a dam-like structure prevents an overflow of underfill material from extending onto the image sensor pixel array during assembly, according to at least some embodiments.

As previously noted, in some embodiments, the discontinuity may include a dam-like structure that is built up (e.g., out of metal, metal oxide, or another material) to prevent underfill material from extending onto the image sensor pixel array during assembly. FIG. 6A is a block diagram illustrating a cross-section of a portion of an image sensor in an imager assembly 600 in which such a dam-like structure has been constructed, according to at least some embodiments. FIG. 6B is a block diagram illustrating a backside view of the image sensor 602 in imager assembly 600, according to at least some embodiments.

In this example, imager assembly 600 includes a sensor die 602 (e.g., an integrated circuit that includes an active-pixel image sensor) and a printed circuit board substrate 604 (which includes an opening through which light may pass). In this example, sensor die 602 and PCB 604 are physically and electrically connected to each other through copper pillars 615, and underfill 612 (which may or may not include an anti-reflective material, in this example) has been introduced into the space between sensor die 602 and PCB 604 for reinforcement of these connections. In this example, a dam-like discontinuity 614 has been built up on sensor die 602. Discontinuity 614 appears protruding down from the backside of sensor die 602 in FIG. 6A, and the frame formed by discontinuity 614 defines a keep out area on the sensor die 602. In some embodiments, the width of the dam material (i.e., the width of the frame formed by the dam material and surrounding the active area) may be on the order of 1-10 µm. In this example, the physical properties of discontinuity 614 have (during assembly) prevented underfill 612 from spilling over into the area framed by discontinuity 614 (which includes active area 618) during the assembly process.

In this example, sensor die 602 and PCB 604 may include contact pads through which connections to copper pillars 615 are made (e.g., for each of multiple contact pads 620 shown on sensor die 602, there may be a corresponding contact pad on PCB 604, and the contact pads in each such pair may be connected to each other through a respective copper pillar). Again note that the number of contact pads may vary, depending on the functionality of the image sensor and/or the imager into which it will be assembled.

In this example, sensor die 602 is mounted using a flip chip packaging technology such that the active area (e.g., the pixel array of the active-pixel image sensor) faces PCB 604. Light may enter a device or apparatus that includes imager assembly 600 (e.g., a digital camera, mobile phone, or smart phone) through an opening in PCB 604. In some embodiments, the light may also pass through glass and/or one or more lenses before reaching the pixel array of the active-pixel image sensor on sensor die 602 (either before or after passing through the opening in PCB 604 (not shown).

In other embodiments, a discontinuity created to prevent the overflow of underfill material in the active area may include a trench. For example, a trench may be created on the image sensor die using a dry etch process, a wet etch process, a laser, or other means, in different embodiments. In embodiments in which such a trench has been created on the image sensor die, if an over-abundance of underfill material is introduced into the space between the image sensor die and the PCB on which it is mounted during the assembly of the imager, the excess underfill material may flow into (and be contained by) the trench, rather than spilling over into the active area (or, potentially, onto the pixel array).

Figure 7A:
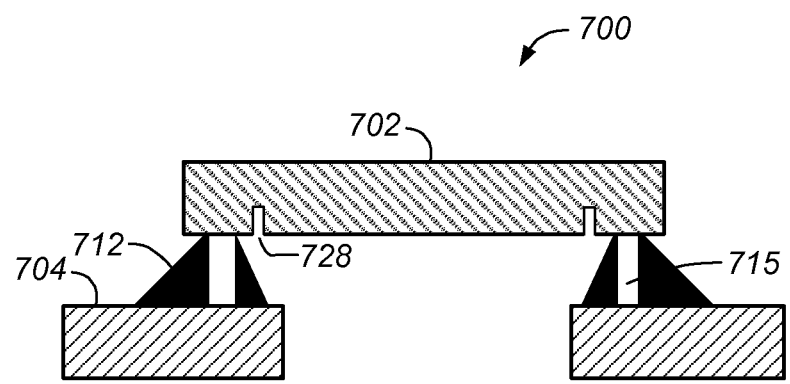
FIG. 7A is a block diagram illustrating a cross-section of an image sensor in an imager assembly that includes a trench-like structure for preventing underfill material from extending onto the image sensor pixel array during assembly, according to at least some embodiments.
Figure 7B:
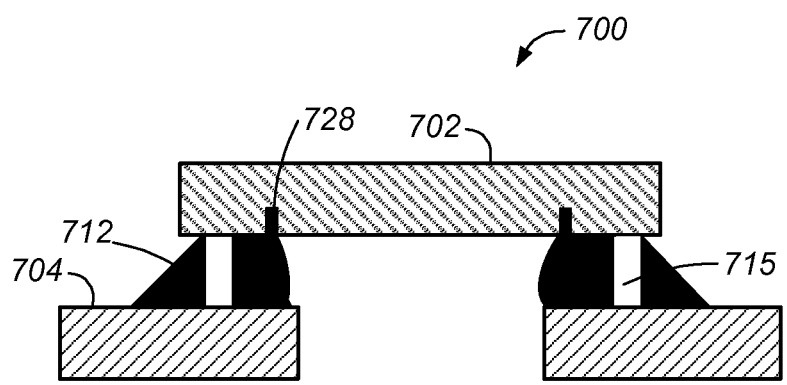
FIG. 7B is a block diagram illustrating a cross-section of an image sensor in an imager assembly in which a trench-like structure prevents an overflow of underfill material from extending onto the image sensor pixel array during assembly, according to at least some embodiments

FIGS. 7A and 7B illustrate the use of a trench-like discontinuity in controlling the overflow of underfill material, according to at least some embodiments. More specifically, FIG. 7A is a block diagram illustrating a cross-section of an image sensor in an imager assembly 700 that includes a trench-like structure for preventing underfill material from extending onto the image sensor pixel array during assembly, and FIG. 7B is a block diagram illustrating a cross-section of the image sensor in imager assembly 700 in which the trench-like structure has prevented an overflow of underfill material from extending onto the image sensor pixel array during assembly, according to at least some embodiments. In both of these diagrams, the imager assembly 700 includes a sensor die 702 (e.g., an integrated circuit that includes an active-pixel image sensor) and a printed circuit board substrate 704 (which includes an opening through which light may pass).

In these examples, sensor die 702 and PCB 704 are physically and electrically connected to each other through copper pillars 715, and underfill 712 (which may or may not include an anti-reflective material, in this example) has been introduced into the space between sensor die 702 and PCB 704 for reinforcement of these connections. In these examples, a trench-like discontinuity 728 has been created on sensor die 702 (e.g., using a dry etch process, a wet etch process, a laser, or other means). Discontinuity 728, which is empty of any underfill material in FIG. 7A, forms a frame that defines a keep out area on the sensor die 702 (not shown). In FIG. 7B, a portion of underfill 712 has overflowed (during assembly) and has filled in the trench-like discontinuity 728 on sensor die 702. However, the physical properties of discontinuity 728 have prevented underfill 712 from spilling over into the area framed by discontinuity 728 (which includes the active area of sensor die 702) during the assembly process.

In these examples, sensor die 702 and PCB 704 may include contact pads through which connections to copper pillars 715 are made (e.g., for each of multiple contact pads on sensor die 702, there may be a corresponding contact pad on PCB 704, and the contact pads in each such pair may be connected to each other through a respective copper pillar). Again note that the number of contact pads may vary, depending on the functionality of the image sensor and/or the imager into which it will be assembled.

In these examples, sensor die 702 is mounted using a flip chip packaging technology such that the active area (e.g., the pixel array of the active-pixel image sensor) faces PCB 704. Light may enter a device or apparatus that includes imager assembly 700 (e.g., a digital camera, mobile phone, or smart phone) through an opening in PCB 704. In some embodiments, the light may also pass through glass and/or one or more lenses before reaching the pixel array of the active-pixel image sensor on sensor die 702 (either before or after passing through the opening in PCB 704 (not shown).

In still other embodiments, a discontinuity created to prevent the overflow of underfill material in the active area may be created using a low surface tension material (e.g., a chemical vapor deposited polymeric material or a similar material). In such embodiments, a thin coating of such a material may be sufficient to impede the capillary action of an overflow of underfill material. For example, the thickness of the low surface tension material may be on the order of a few angstroms up to 10 microns, in different embodiments, while the width of the discontinuity region (e.g., discontinuity 514 in FIG. 5) may be on the order of 1-100 μm. In general, this technique may employ any of a variety of materials that have different surface tension properties (e.g., a lower surface tension) than the underfill material and/or the other material present on the PCB substrate or image sensor die. Note that in several of the drawings included herein, the discontinuity (e.g., the dam-like structure, trench-like structure, or chemical-based discontinuity) is illustrated as being located in the portion of the space between the sensor die and the PCB in which the PCB and the image sensor overlap. However, in other embodiments, the discontinuity may be located (at least partially) in other portions of the space between the sensor die and the PCB. For example, it may be located in a portion of the space between the sensor die and the PCB in which the PCB and sensor do not overlap (or do not overlap completely), as long as it lies outside the active area of the sensor (e.g., the pixel array area). In some embodiments, the discontinuity region may be aligned with the inside edge of the PCB (e.g., the edge of the opening in the PCB through which light passes to reach the sensor die).

Note that in some embodiments, the techniques described herein for preventing image artifacts due to underfill may be used together in different combinations. For example, embodiments that include a dam-like discontinuity may also include a trench-like discontinuity (e.g., between the bond pads and the dam-like discontinuity) in order to contain a larger amount of underfill material than could be contained using only one of these structures. In another example, embodiments that include a trench-like discontinuity may also include a coating of a low surface tension material (e.g., in and/or on either side of the trench-like structure) in order to further impede the overflow of underfill material into the keep out zone defined by the trench-like structure. In some embodiments, in which a dam-like discontinuity is built up, the dam layer may be built up using oxidized copper layers, which may cause fewer reflections and reduce surface tension, as compared to an un-oxidized copper pillar. In some embodiments, in order to minimize reflections off of the underfill material in the case that there is insufficient underfill material and light is able to get in, the surface of the dam-like structure may be oxidized or rough up the surface (e.g., by etch holes or otherwise making the surface bumpy). Note that while in some embodiments, copper pillars or oxidized copper pillars may be used to create a dam-like discontinuity on the image sensor die, in other embodiments, the discontinuity may be built using nickel, palladium, or solder. However, because tin silver (which is commonly used in solder) may be too reflective for this use, if solder is used to build the discontinuity, a post-plating treatment may be applied to the solder to make it less reflective.

Figure 8:
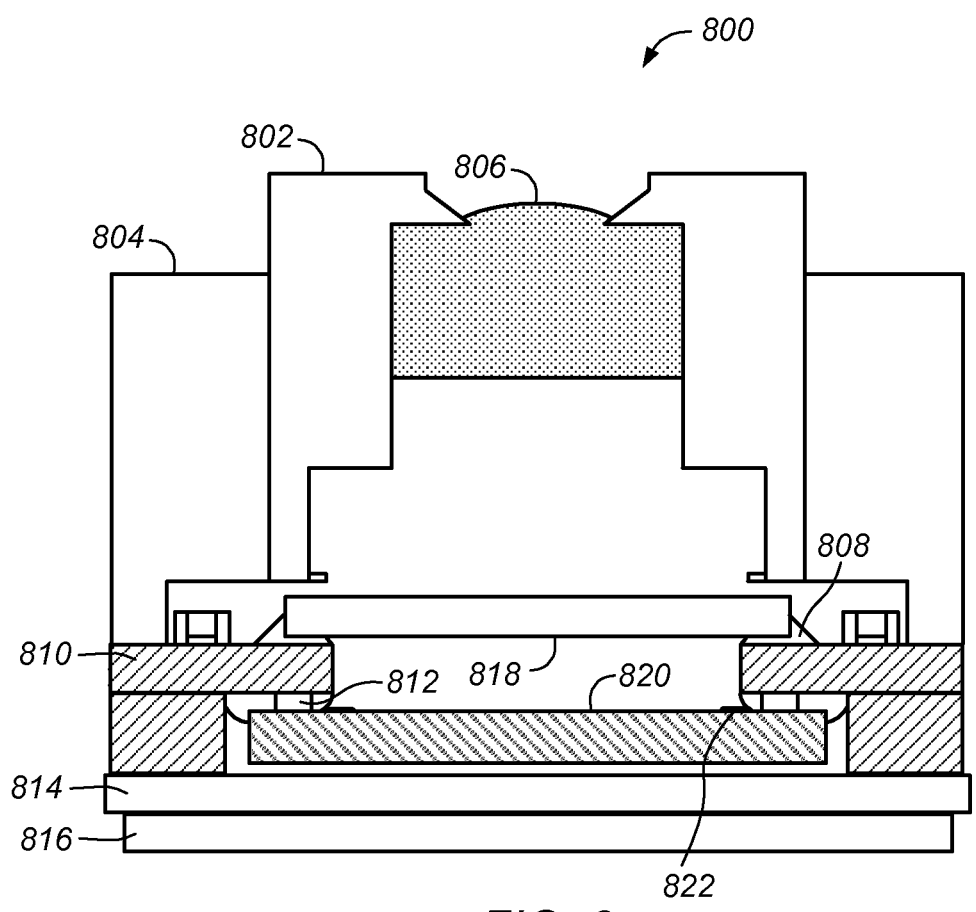
FIG. 8 is a block diagram illustrating one embodiment of a camera that includes an imager assembly.

FIG. 8 is a block diagram illustrating a cross-section of a camera that includes an imager assembly, according to at least some embodiments. In this example, the camera (800) includes housing components 802 and 804, one or more lenses 806, a cover glass 818, a sensor die 820, a PCB substrate 810, multiple electrically conductive connectors 812 (which may include solder bumps, plated copper pillars, or other structures), and other stacked components 814 and 816. In this example, underfill 808 (which may or may not include an anti-reflective material such as carbon black pigment) has (during assembly) been introduced between sensor die 820 and PCB 810 to reinforce the connections made by connectors 812, and a chemical discontinuity 822 on sensor die 820 (shown in FIG. 8 at an exaggerated size for clarity) has prevented underfill 808 from entering the area framed by the chemical discontinuity 822 (which includes an active image sensor pixel array on sensor die 820).

Note that in the block diagram in FIG. 8, light enters the camera from the top of the diagram. Note also that in this and other examples described herein, in a stacked-die arrangement, there may be another integrated circuit on the backside of the sensor die (i.e., on the side away from the light source). For example, in some embodiments, a processor or logic die (e.g., one that includes at least some image processing functionality) may be mounted between sensor die 820 and component 814 in FIG. 8.

Figure 9:
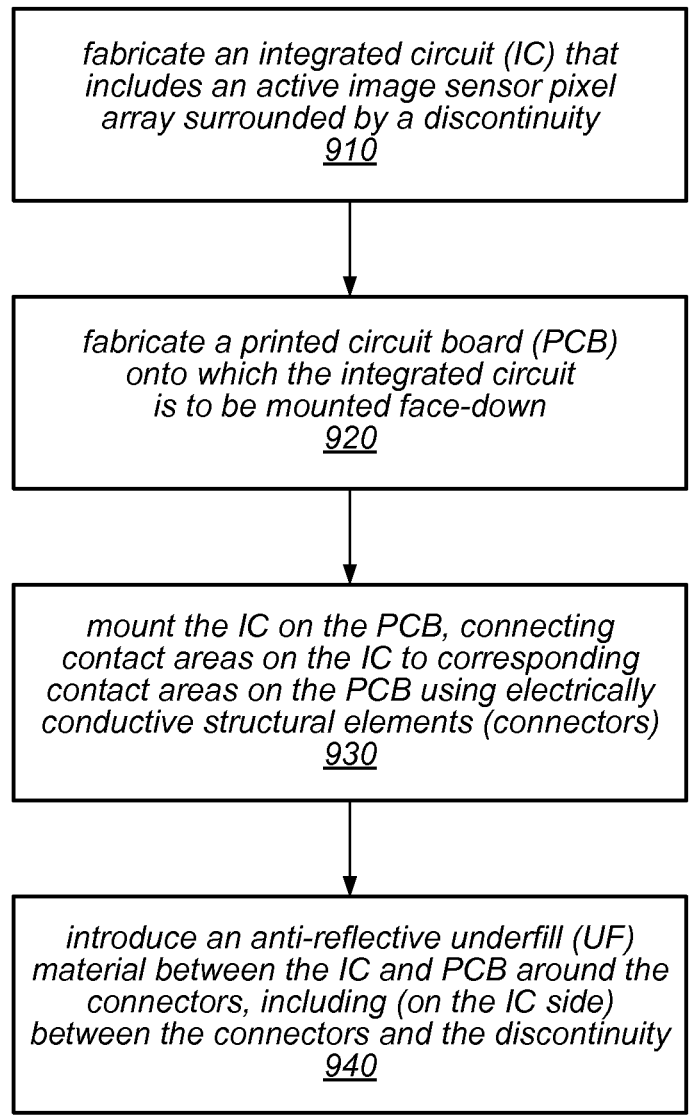
FIG. 9 is a high-level flow diagram illustrating one embodiment of a method for creating an imager assembly.

One embodiment of a method for creating an imager assembly is illustrated by the high-level flow diagram in FIG. 9. As illustrated at 910, the method may include fabricating an integrated circuit (IC) device that includes an active image sensor pixel array surrounded by a discontinuity region (e.g., a region of the IC that includes physical or chemical discontinuity between the active image sensor pixel array and the contact areas for connections to a PCB onto which it will be mounted). For example, in various embodiments, fabricating the IC may include creating a physical discontinuity by building up metal or metal oxide to form a dam-type structure on the integrated circuit device or by forming a trench in the integrated circuit device, and/or it may include creating a chemical discontinuity by introducing a low surface tension material on the surface of the integrated circuit device. As described herein, the discontinuity created when the IC is fabricated may prevent an underfill material from overflowing onto the active image sensor pixel array during assembly of the imager, in some embodiments. Fabricating the IC may also include constructing contact areas on the IC for connecting the IC to the electrically conductive structures (e.g., solder bumps, copper pillars, or other structures) through which the IC will be physically and electrically connected to the PCB.

As illustrated at 920, in this example, the method may also include fabricating a printed circuit board (PCB) onto which the integrated circuit is to be mounted face-down (e.g., using flip-chip packaging technology to mount the IC to the PCB such that the active pixel array is facing toward the PCB). Fabricating the PCB may include constructing contact areas on the PCB for connecting the PCB to the electrically conductive structures (e.g., solder bumps, copper pillars, or other structures) through which the PCB will be physically and electrically connected to the IC.

The method may also include mounting the IC on the PCB, connecting the contact areas on the IC to the corresponding contact areas on the PCB using electrically conductive structural elements (connectors), as in 930. For example, contact pads or leads on the IC and PCB may be physically and electrically coupled to each other using solder bumps, metal pillars, or other electrically conductive structural elements, in different embodiments. The method may also include introducing an anti-reflective underfill (UF) material between the IC and PCB around the connectors, including (on the IC side) between the connectors and the discontinuity, as in 940. In some embodiments, the underfill material may include carbon black pigments, while in other embodiments, the underfill material may include another type of anti-reflective material. In various embodiments, if the underfill is introduced in the area between the contact areas and the discontinuity, the discontinuity may prevent it from overflowing past the discontinuity and onto the active image sensor pixel array.

In various embodiments, the techniques and structures described herein may prevent a variety of image artifacts due to underfill in CMOS imager assemblies. For example, they may reduce flares from stray lights due to reflections off of the underfill or interconnect structures, may reduce or eliminate residual resin induced reflections, and may prevent performance or quality degradation due to the overflow of underfill material onto the active area (e.g., the pixel array of the image sensor). In addition, as described herein, these techniques may allow the pixel array area to be maximized, even as image sensor die areas continue to shrink.

Note that while the example techniques and structures described herein are primarily directed to reducing or preventing image artifacts in CMOS imagers, in some embodiments, techniques and structures similar to those described herein may be applied to reduce or prevent image artifacts in N-type metal-oxide-semiconductor (NMOS) image sensors and/or semiconductor charge-coupled devices (CCD) image sensors.

Figure 10:
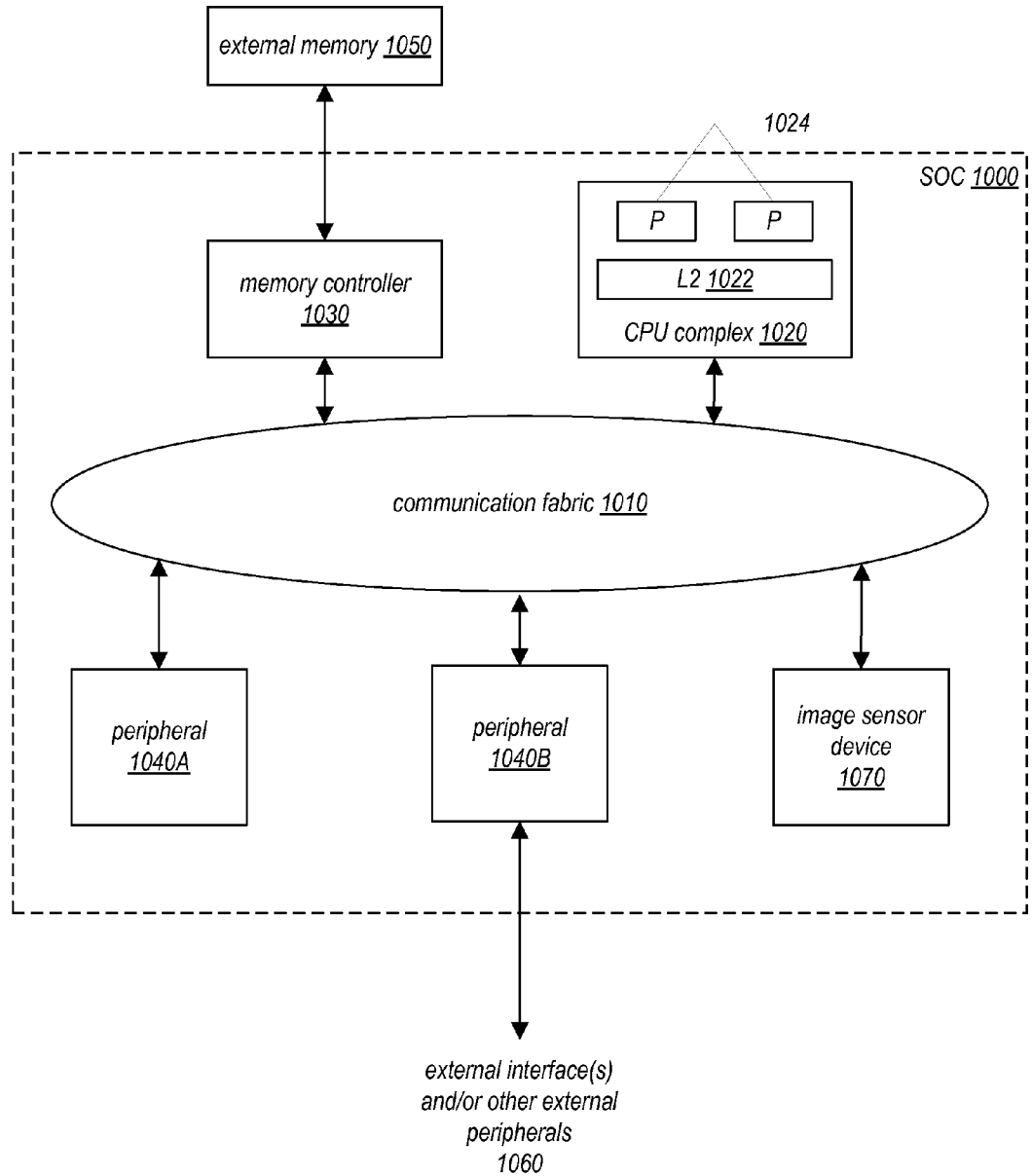
FIG. 10 is a block diagram illustrating one embodiment of a system on a chip (SOC) that includes an image sensor device.

Turning now to FIG. 10, a block diagram of one embodiment of a system-on-a-chip (SOC) 1000 may include at least one instance of an image sensor device 1070, which may include a CMOS imager assembly that employs one or more of the techniques and/or structures described herein for preventing image artifacts due to underfill material. SOC 1000 is shown coupled to a memory 1050. As implied by the name, the components of the SOC 1000 may be integrated onto a single semiconductor substrate as an integrated circuit "chip." In some embodiments, the components may be implemented on two or more discrete chips in a system. However, the SOC 1000 will be used as an example herein. In the illustrated embodiment, the components of the SOC 1000 include a central processing unit (CPU) complex 1020, on-chip peripheral components 1040A-1040B (more briefly, "peripherals"), a memory controller (MC) 1030, an image sensor device 1070 (which may itself be considered a peripheral component), and a communication fabric 1010. The components 1020, 1030, 1040A-1040B, and 1070 may all be coupled to the communication fabric 1010. The memory controller 1030 may be coupled to the memory 1050 during use, and the peripheral 1040B may be coupled to one or more external interfaces or external peripheral devices 1060 during use. In the illustrated embodiment, the CPU complex 1020 includes one or more processors (P) 1024 and a level two (L2) cache 1022. In some embodiments, the CPU complex may be configured to cache data used in various image processing applications to operate on image data captured by image sensor device 1070. Note that in other embodiments, an image sensor device (such as any of the imager assemblies described herein) may be located on another device (e.g., on one of external devices 1060) and may be in communication with SOC 1000 (e.g., through an external interface 1060), instead of or in addition to an image sensor device 1070 being included on SOC 1000.

The peripherals 1040A-1040B may be any set of additional hardware functionality included in the SOC 1000. For example, the peripherals 1040A-1040B may include an image signal processor configured to process image capture data (e.g., video or discreet images) from a camera that includes an imager assembly, from image sensor device 1070 or other image sensor, display controllers configured to display image data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include peripheral interface controllers for various interfaces 1060 external to the SOC 1000 (e.g. the peripheral 1040B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

The CPU complex 1020 may include one or more CPU processors 1024 that serve as the CPU of the SOC 1000. The CPU of the system includes the processor(s) that execute the main control software of the system, such as an operating system. Generally, software executed by the CPU during use may control the other components of the system to realize the desired functionality of the system and/or to process image information captured by image sensor 1070 for transmission, display, manipulation, and/or storage. The processors 1024 may also execute other software, such as application programs. The application programs may provide user functionality, and may rely on the operating system for lower level device control. Accordingly, the processors 1024 may also be referred to as application processors. The CPU complex 1020 may further include other hardware such as the L2 cache 1022 and/or and interface to the other components of the system (e.g. an interface to the communication fabric 1010). Generally, a processor may include any circuitry and/or microcode configured to execute instructions defined in an instruction set architecture implemented by the processor. The instructions and data operated on by the processors in response to executing the instructions may generally be stored in the memory 1050, although certain instructions may be defined for direct processor access to peripherals as well. Processors may encompass processor cores implemented on an integrated circuit with other components as a system on a chip (SOC 1000) or other levels of integration. Processors may further encompass discrete microprocessors, processor cores and/or microprocessors integrated into multichip module implementations, processors implemented as multiple integrated circuits, etc.

The memory controller 1030 may generally include the circuitry for receiving memory operations from the other components of the SOC 1000 and for accessing the memory 1050 to complete the memory operations. The memory controller 1030 may be configured to access any type of memory 1050. For example, the memory 1050 may be static random access memory (SRAM), dynamic RAM (DRAM) such as synchronous DRAM (SDRAM) including double data rate (DDR, DDR2, DDR3, etc.) DRAM. Low power/mobile versions of the DDR DRAM may be supported (e.g. LPDDR, mDDR, etc.). The memory controller 1030 may include queues for memory operations, for ordering (and potentially reordering) the operations and presenting the operations to the memory 1050. The memory controller 1030 may further include data buffers to store write data awaiting write to memory and read data awaiting return to the source of the memory operation. In some embodiments, the memory controller 1030 may include a memory cache to store recently accessed memory data. In SOC implementations, for example, the memory cache may reduce power consumption in the SOC by avoiding re-access of data from the memory 1050 if it is expected to be accessed again soon. In some cases, the memory cache may also be referred to as a system cache, as opposed to private caches such as the L2 cache 1022 or caches in the processors 1024, which serve only certain components. Additionally, in some embodiments, a system cache need not be located within the memory controller 1030.

In an embodiment, the memory 1050 may be packaged with the SOC 1000 in a chip-on-chip or package-on-package configuration. A multichip module configuration of the SOC 1000 and the memory 1050 may be used as well. Such configurations may be relatively more secure (in terms of data observability) than transmissions to other components in the system (e.g. to various end points, not shown). Accordingly, protected data may reside in the memory 1050 unencrypted, whereas the protected data may be encrypted for exchange between the SOC 1000 and external endpoints.

The communication fabric 1010 may be any communication interconnect and protocol for communicating among the components of the SOC 1000. The communication fabric 1010 may be bus-based, including shared bus configurations, cross bar configurations, and hierarchical buses with bridges. The communication fabric 1010 may also be packet-based, and may be hierarchical with bridges, cross bar, point-to-point, or other interconnects.

It is noted that the number of components of the SOC 1000 (and the number of subcomponents for those shown in FIG. 10, such as within the CPU complex 1020) may vary from embodiment to embodiment. There may be more or fewer of each component/subcomponent than the number shown in FIG. 10.

Example System

Figure 11:
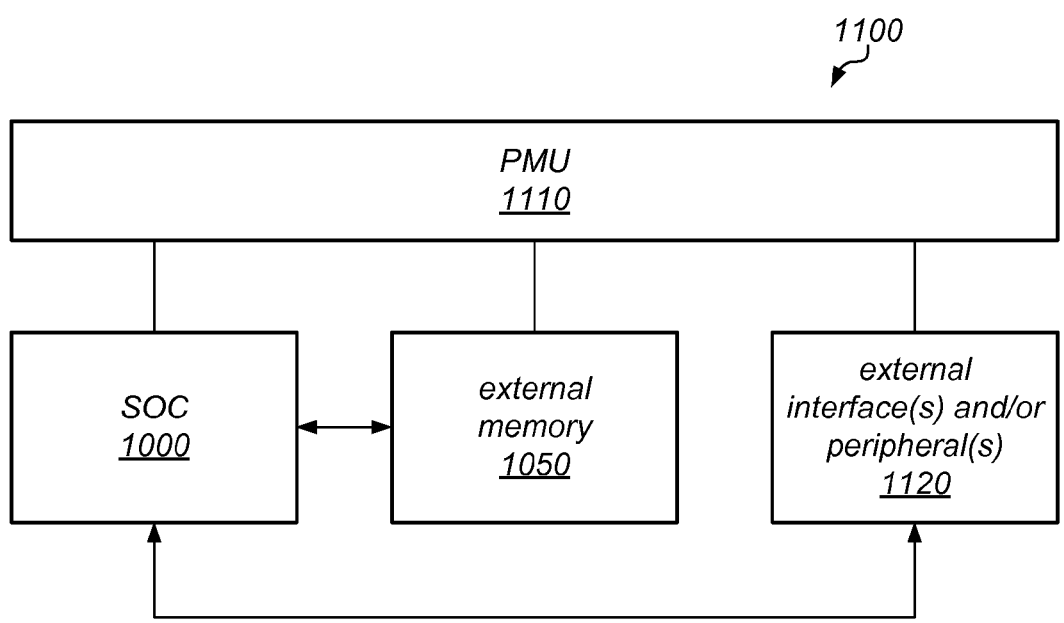
FIG. 11 is a block diagram illustrating one embodiment of a system that includes at least one instance of an SOC.

FIG. 11 a block diagram of one embodiment of a system 1100. In the illustrated embodiment, the system 1100 includes at least one instance of the SOC 1000 coupled to one or more external peripherals 1120 and the external memory 1050. A power management unit (PMU) 1110 is provided which supplies the supply voltages to the SOC 1000 as well as one or more supply voltages to the memory 1050 and/or the peripherals 1120. In some embodiments, more than one instance of the SOC 1000 may be included (and more than one memory 1050 may be included as well).

The peripherals 1120 may include any desired circuitry, depending on the type of system 1100. For example, in one embodiment, the system 1100 may be a mobile device (e.g. personal digital assistant (PDA), smart phone, etc.) and the peripherals 1120 may include devices for various types of wireless communication, such as wifi, Bluetooth, cellular, global positioning system, etc. The peripherals 1120 may also include additional storage, including RAM storage, solid state storage, or disk storage. The peripherals 1120 may include user interface devices such as a display screen, including touch display screens or multitouch display screens, keyboard or other input devices, microphones, speakers, etc. In some embodiments, the peripherals 1120 may include an image sensor device, such as any of the imager assemblies described herein. In other embodiments, the system 1100 may be any type of computing system (e.g. desktop personal computer, laptop, workstation, net top etc.).

The external memory 1050 may include any type of memory. For example, the external memory 1050 may be SRAM, dynamic RAM (DRAM) such as synchronous DRAM (SDRAM), double data rate (DDR, DDR2, DDR3, etc.) SDRAM, RAMBUS DRAM, low power versions of the DDR DRAM (e.g. LPDDR, mDDR, etc.), etc. The external memory 1050 may include one or more memory modules to which the memory devices are mounted, such as single inline memory modules (SIMMs), dual inline memory modules (DIMMs), etc. Alternatively, the external memory 1050 may include one or more memory devices that are mounted on the SOC 1000 in a chip-on-chip or package-on-package implementation.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A computer system, comprising:
    a printed circuit board;
    an integrated circuit device distinct from the printed circuit board, the integrated circuit device comprising an image sensor pixel array;
    a plurality of electrically conductive interconnect structures; and
    a composite underfill material comprising a polymer and one or more fillers;
    wherein the integrated circuit device is coupled to the printed circuit board by the interconnect structures at respective points on the integrated circuit device and the printed circuit board such that the image sensor pixel array faces the printed circuit board;

wherein the composite underfill material envelopes at least a portion of each of the interconnect structures in a space between the integrated circuit device and the printed circuit board; and wherein a chemical or physical discontinuity situated on the integrated circuit device surrounds the image sensor pixel array and prevents the composite underfill material from extending over the image sensor pixel array.

2. The computer system of claim 1, wherein the discontinuity comprises metal or metal oxide that forms a dam-type structure on the integrated circuit device.

3. The computer system of claim 1, wherein the discontinuity comprises a low surface tension material that is built up on the integrated circuit device, forming a chemical discontinuity that prevents the composite underfill material from flowing over the discontinuity.

4. The computer system of claim 1, wherein the discontinuity comprises a trench on the integrated circuit device.

5. The computer system of claim 1, wherein the composite underfill material comprises an anti-reflective filler material.

6. The computer system of claim 5, wherein the anti-reflective filler material comprises carbon black pigment.

7. The computer system of claim 1, wherein the interconnect structures comprise plated solder bumps.

8. The computer system of claim 1, wherein the interconnect structures comprise plated copper pillars.

9. The computer system of claim 1, wherein a width or a diameter of at least one of the interconnect structures is less than 30 μm.

10. An integrated circuit device, comprising:
an image sensor pixel array situated on a particular surface of the integrated circuit device;
a plurality of contact pads for electrically conductive interconnect structures at respective points outside of the image sensor pixel array on the side of the integrated circuit device that comprises the image sensor pixel array;
a chemical or physical discontinuity situated on the particular surface of the integrated circuit device and surrounding the image sensor pixel array between the image sensor array and the plurality of contacts pads and that is configured to prevent an underfill material from extending over the image sensor pixel array during assembly of an imager that includes the integrated circuit device into a flip chip package.

11. The integrated circuit device of claim 10, wherein the discontinuity comprises metal or metal oxide that forms a dam-type structure on the integrated circuit device.

12. The integrated circuit device of claim 10, wherein the discontinuity comprises a trench.

13. The integrated circuit device of claim 10, wherein the discontinuity comprises a low surface tension material that is built up on the integrated circuit device, forming a chemical discontinuity that prevents the underfill material from flowing past the discontinuity.

14. The integrated circuit device of claim 13, wherein the low surface tension material comprises a chemical vapor deposited polymeric material.

15. The integrated circuit device of claim 10, wherein the contact pads are configured to form a connection with interconnect structures that comprise solder bumps or copper pillars.

16. The integrated circuit device of claim 10, wherein the contact pads or interconnect structures comprise gold plating.

17. A method, comprising:
fabricating an integrated circuit device comprising an active image sensor pixel array situated on a particular surface of the integrated circuit device and a plurality of contact pads for respective electrically conductive interconnect structures, wherein the image sensor pixel array is surrounded by a physical or chemical discontinuity situated on the same particular surface of the integrated circuit device as the active image sensor pixel array and between the active image sensor pixel array and the contact pads;
fabricating a printed circuit board distinct from the integrated circuit device, the printed circuit board comprising a plurality of contact pads for the electrically conductive interconnect structures;
mounting the integrated circuit device on the printed circuit board, wherein said mounting comprises:
forming physical and electrically conductive connections between the contact pads on the integrated circuit device and the contact pads on the printed circuit board through the electrically conductive interconnect structures; and
introducing a composite underfill material comprising a polymer and one or more fillers into a space between the integrated circuit device and the printed circuit board in a manner such that the composite underfill material envelopes at least a portion of each of the interconnect structures;
wherein during said mounting, the physical or chemical discontinuity prevents the composite underfill material from extending over the image sensor pixel array.

18. The method of claim 17, wherein said fabricating the integrated circuit device comprises creating the physical discontinuity by building up metal or metal oxide to form a dam-type structure on the integrated circuit device or by forming a trench in the integrated circuit device.

19. The method of claim 17, wherein said fabricating the integrated circuit device comprises creating a chemical discontinuity by introducing a low surface tension material on the surface of the integrated circuit device.

20. The method of claim 17, wherein the composite underfill material comprises an anti-reflective filler material.

* * * * *